United States Patent
Yamada

(10) Patent No.: US 9,478,721 B2
(45) Date of Patent: Oct. 25, 2016

(54) FLEXIBLE SUBSTRATE MEMBER AND LIGHT EMITTING DEVICE

(71) Applicant: NICHIA CORPORATION, Anan-shi, Tokushima (JP)

(72) Inventor: Motokazu Yamada, Tokushima (JP)

(73) Assignee: NICHIA CORPORATION, Anan-shi (JP)

(*) Notice: Subject to any disclaimer, the term of this patent is extended or adjusted under 35 U.S.C. 154(b) by 58 days.

(21) Appl. No.: 14/483,349

(22) Filed: Sep. 11, 2014

(65) Prior Publication Data
US 2015/0069453 A1    Mar. 12, 2015

(30) Foreign Application Priority Data
Sep. 12, 2013 (JP) ................ 2013-189461

(51) Int. Cl.
| H01L 33/00 | (2010.01) |
| H01L 33/62 | (2010.01) |
| H05K 1/18 | (2006.01) |
| H01L 25/075 | (2006.01) |

(52) U.S. Cl.
CPC ............ *H01L 33/62* (2013.01); *H05K 1/189* (2013.01); *H01L 25/0753* (2013.01); *H01L 2924/0002* (2013.01); *H05K 2201/0397* (2013.01); *H05K 2201/09272* (2013.01); *H05K 2201/10106* (2013.01)

(58) Field of Classification Search
CPC ...................................... H01L 33/62

USPC .......................................... 257/99
See application file for complete search history.

(56) References Cited

U.S. PATENT DOCUMENTS

2011/0101383 A1* 5/2011 Hermann ............ H01L 25/0756
257/88

FOREIGN PATENT DOCUMENTS

| JP | 2013-135068 A | 7/2013 |
| JP | 2013-135069 A | 7/2013 |
| JP | 2013-254877 A | 12/2013 |
| WO | 2013-031319 A1 | 3/2013 |

\* cited by examiner

*Primary Examiner* — Ajay K Arora
(74) *Attorney, Agent, or Firm* — Global IP Counselors, LLP

(57) ABSTRACT

A flexible substrate member which can prevent breakage due to bending, regardless of a shape of a metal pattern, and a light emitting device which employs the flexible substrate. The flexible substrate member includes a plurality of metal wirings disposed on an insulating substrate which are spaced apart from each other via a groove portion. The groove portion includes an intersection region where a first groove portion and a second groove portion are intersected. The metal wirings includes a first metal wiring and a second metal wiring which are demarcated via the first groove portion in the intersection region, and a third metal wiring which is demarcated via the second groove portion with respect to the first metal wiring and the second metal wiring. The third metal wiring includes a projection which projects on an extension line of the first groove portion.

20 Claims, 6 Drawing Sheets

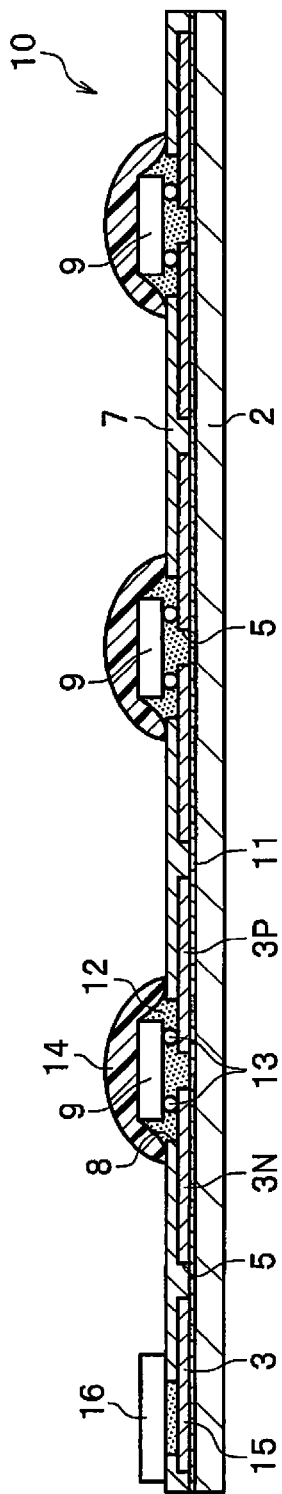
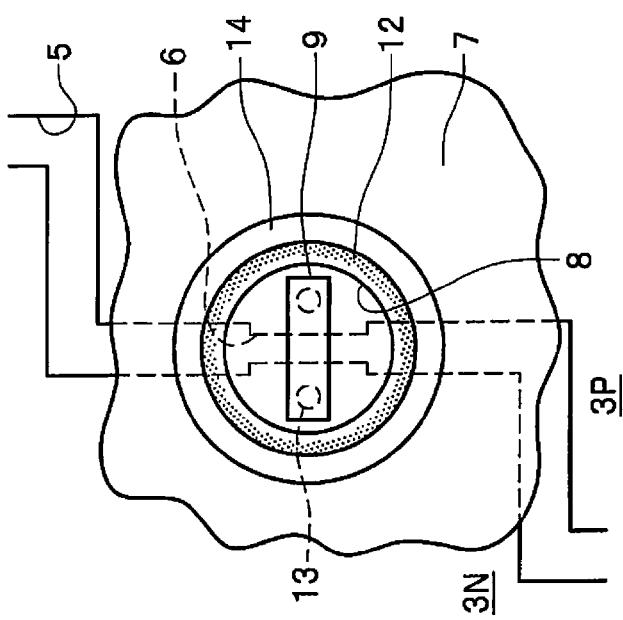
FIG. 4A
FIG. 4B

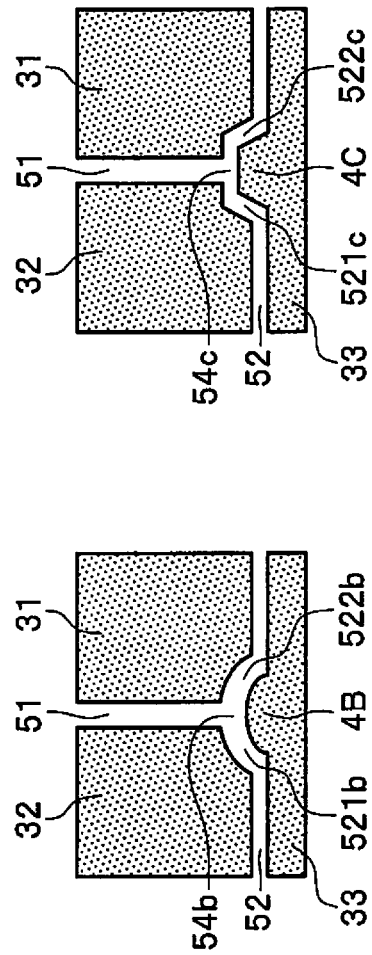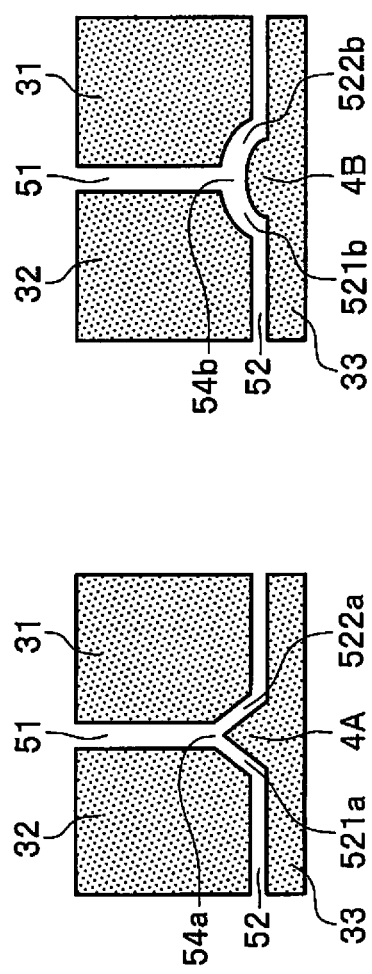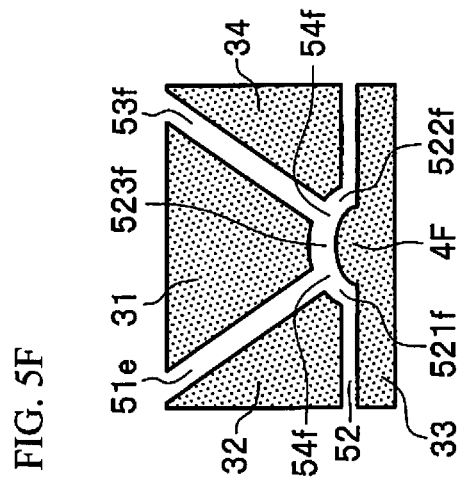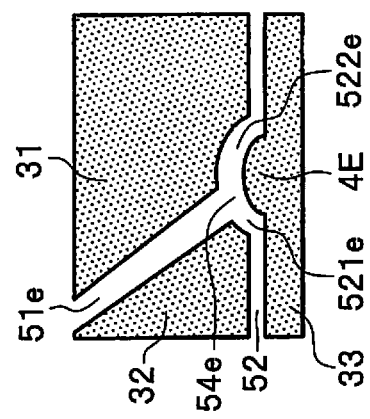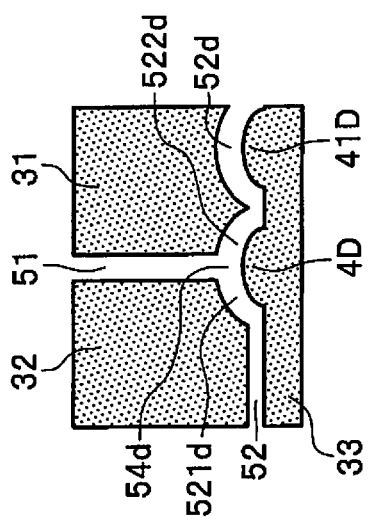

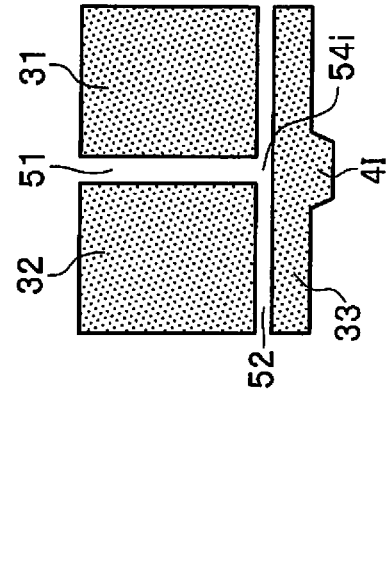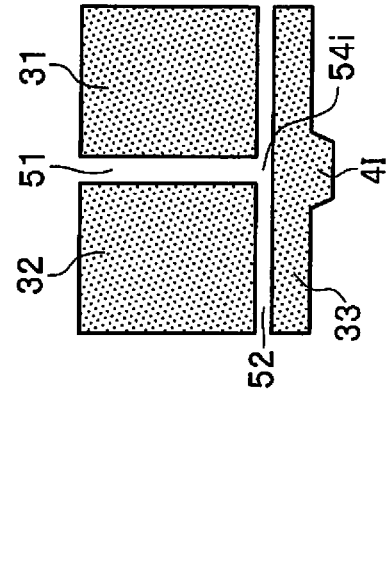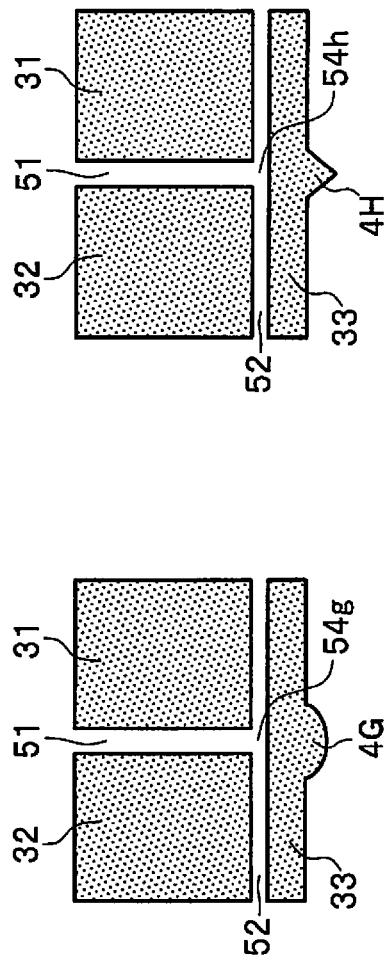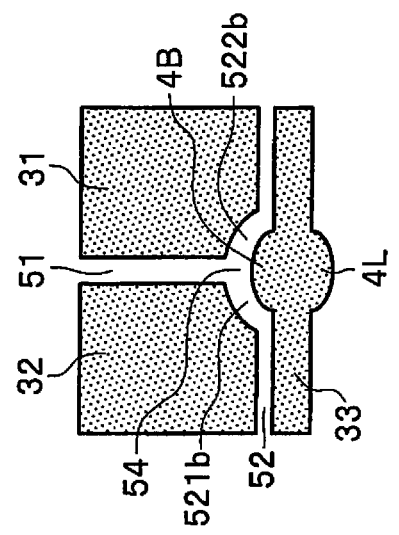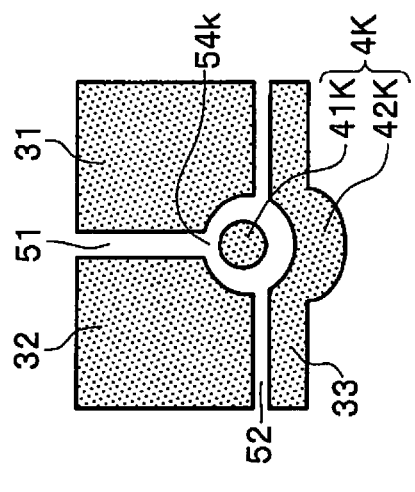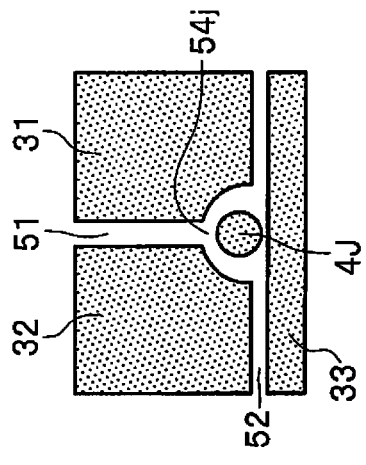

FLEXIBLE SUBSTRATE MEMBER AND LIGHT EMITTING DEVICE

PRIORITY

This application claims priority to Japanese Patent Application No. 2013-189461 filed on Sep. 12, 2013. The entire disclosure of Japanese Patent Application No. 2013-189461 is hereby incorporated herein by reference.

BACKGROUND

1. Technical Field

The present disclosure relates to a flexible substrate member and a light emitting device which uses the flexible substrate member.

2. Background Art

Recently, there has been known a light emitting device which uses a flexible substrate member in which a metal pattern is disposed on a base member made of, for example, a resin. Such a light emitting device has a metal pattern which includes a wiring pattern for supplying electricity to light emitting elements and a reinforcing pattern for imparting rigidity to the flexible substrate member. The reinforcing pattern may be disposed to surround the periphery of the wiring pattern to enhance bending rigidity to improve handling capability (see for example JP2013-135068A).

There has also been known a flexible substrate member in which, in addition to the configuration described above, a resin film is formed to improve the handling capability described above and insulation resistance achieved by the resin film (see for example JP2013-135069A).

SUMMARY

In the exemplary embodiments, a flexible substrate member includes a configuration as set forth below. The flexible substrate member may include a plurality of metal wirings which are spaced apart from each other via a groove portion. The groove portion includes a plurality of intersection regions where a first groove portion and a second groove portion are intersected, respectively. The metal wirings include a first metal wiring and a second metal wiring which are demarcated via the first groove portion in each of the intersection regions, and a third metal wiring which is demarcated with respect to the first metal wiring and the second metal wiring via the second groove portion. The third metal wiring has a projection projecting on an extension line of the first groove portion. The light emitting device includes a plurality of light emitting elements which are respectively mounted on the flexible substrate member.

The flexible substrate member and the light emitting device according to the embodiments exhibit superior effects as described below. The flexible substrate member includes a plurality of projections which are an auxiliary metal wiring area. Each projection is arranged on the extension line of the first groove portion which intersects the second groove portion. Therefore, even when an external bending force is applied along the first groove portion, the metal wirings have been reinforced by the projections, so that breakage of the metal wirings can be prevented.

The light emitting device employs the flexible substrate member in which, a plurality of projections, which are auxiliary metal wiring areas for supporting the strength of the substrate member and are formed on the extension line of respective first groove portions, are formed in the intersection regions. Therefore, breakage hardly occurs at the time of assembling into a product, and thus has good productivity.

BRIEF DESCRIPTION OF THE DRAWINGS

FIG. 4A is a cross sectional view schematically showing a cross section of a light emitting device according to an embodiment and FIG. 4B is a plan view schematically showing an enlarged view of a portion having a light emitting element.

FIGS. 5A to 5F are schematic diagrams each showing a configurations of a projection in an intersection region of a flexible substrate member according to embodiments.

FIGS. 6A to 6F are schematic diagrams each showing a configurations of a projection in an intersection region of a flexible substrate member according to other embodiments.

DETAILED DESCRIPTION OF EMBODIMENTS

Figure 1A:
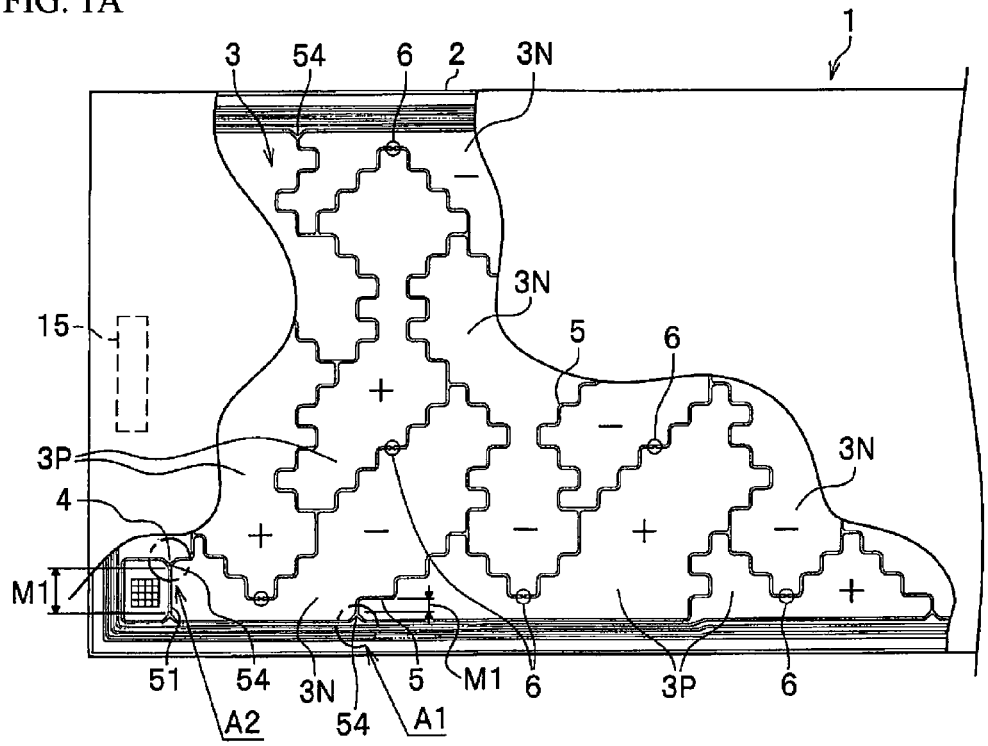
FIG. 1A is a plan view showing a flexible substrate member according to an embodiment, with some portions of the flexible substrate member omitted for clarity.

The embodiments according to the present invention will be described below with reference to the drawings. The sizes and the arrangement relationships of the members in each of drawings are occasionally shown exaggerated for ease of explanation. In the description below, the same designations or the same reference numerals denote the same or like members and duplicative descriptions will be appropriately omitted.

Flexible Substrate Member

Figure 1B:
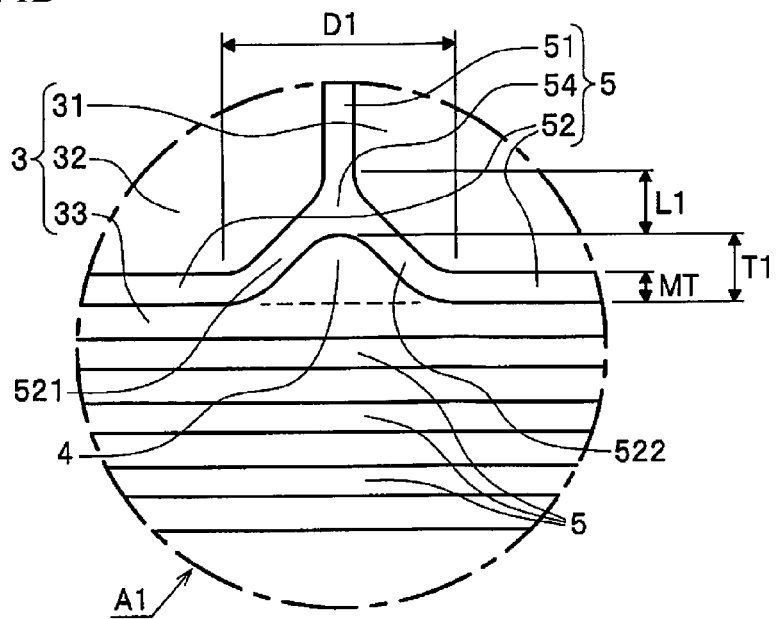
FIG. 1B is a plan view showing an example of a projection at an intersection region of the flexible substrate member.
Figure 2A:
FIGS. 2A to 2D are cross sectional views schematically illustrating each process states of a flexible substrate member according to an embodiment, starting from an insulating substrate of the flexible substrate member to formation of a protective layer.
Figure 2B:
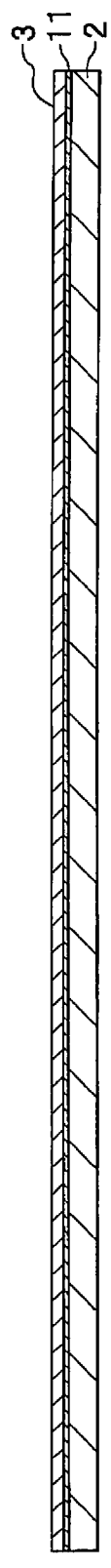
Figure 2C:
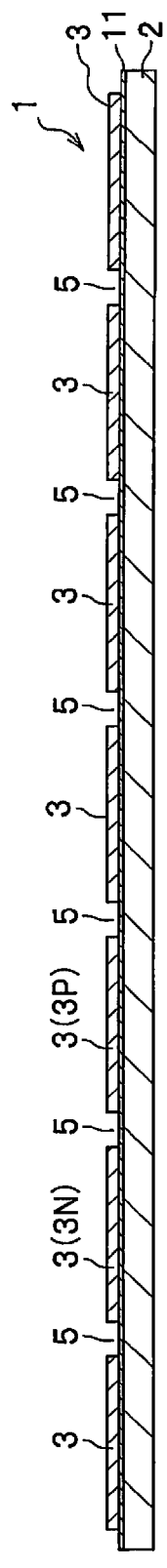

As shown in FIG. 1A and FIG. 2C, a flexible substrate member 1 includes an insulating substrate member 2 and a plurality of metal wirings 3 (3P, 3N) which are disposed on the insulating substrate member 2 and are adjacent to each other via a groove portion 5. The flexible substrate member 1 also includes a plurality of mounting portions 6 of light emitting elements 9 arranged at predetermined positions of the metal wirings 3, and a connector connection part 15 to be electrically connected to outside. The flexible substrate member 1 will be, as shown in FIG. 1B, illustrated with a configuration in which a first metal wiring 31, a second metal wiring 32, and a third metal wiring 33 which constitute a plurality of metal wiring portions 3, are spaced from each other and demarcated via a first groove portion 51 and a second groove portion 52 which constitute a groove portion 5.

The insulating substrate member 2 is a substrate member made of an insulator such as a resin, examples thereof include a resin film (or a resin sheet) of polyimide, PET, PEN. PES, etc. The insulating substrate member 2 has excellent flexibility and formed with a flexibility, size, and thickness which allow production in a roll-to-roll processing. The insulating substrate member 2 has a thickness, for example, in a range of 10 to 400 µm. The width, thickness, and size of the insulating substrate member 2 are appropriately designed according to each product to which the insulating substrate 2 is installed. For example, the insulating substrate member 2 is formed with a resin film of several square meters, which is cut into an appropriate length and width, for example, a width of 1 to 20 cm, a length of 1 to 100 cm, at the time of assembling a device. Further, the insulating substrate member 2 has the metal wirings 3 via an adhesive material 11 on one side of the surface. The adhesive material 11 is not specifically limited as long as it can be used to connect the metal wirings 3 to the insulating substrate member 2.

As shown in FIG. 1A, the metal wirings 3 which include a plurality of positive electrode wiring patterns 3P and a plurality of negative electrode wiring patterns 3N are made of a metal foil such as a copper foil, a copper alloy foil, an aluminum foil, or an aluminum alloy foil. The metal wirings 3 are provided as wiring patterns to supply electricity to electron elements such as a light emitting element 9 to be described below, and are formed spaced apart from each other via the groove portion 5. The metal wirings 3 have a thickness, for example, in a range of 9 to 200 µm. Further, at each of the predetermined positions, a mounting portion 6 for connecting a light emitting element 9 is formed. The mounting portion 6 includes, as shown in FIG. 4B, a portion where the width of the groove MT (see FIG. 1B) of the groove portion 5 is partially narrowed, in other words, a portion where the portions of the metal wiring 3 are extended toward each other. As described above, extending a part of the metal wiring 3 can limit the region where the adhesive agent such as a solder spreads. Thus, the light emitting element 9 can be mounted at a predetermined position with good positional accuracy by using self-alignment.

As shown in FIG. 1B, the metal wirings 3 are formed spaced apart from each other, to a first metal wiring 31, a second metal wiring 32, and a third metal wiring 33, via the groove portions 5 of a first groove portion 51, a second groove portion 52, and an intersection region 54 where the first groove portion 51 intersects the second groove portion 52. The third metal wiring 32 includes a first side abutting the second groove portion 52 and a second side opposite the first side. The intersection region 54 is formed in a range shown by L1. As shown in FIGS. 1A and 1B, the first metal wirings 31 are positive electrode wiring patterns 3P, the second metal wirings 32 are negative electrode wiring patterns 3N, and the third metal wirings 33 are positive electrode wiring patterns 3P. That is, the first metal wirings 31 to the third metal wirings 33 are respectively formed either the positive electrode wiring pattern 3P or the negative electrode wiring pattern 3N. Also, in the intersection region 54, for convenience, the groove portion 5 is sectioned into, for example, a second groove portion 52 which is continuously formed along the longitudinal direction of the insulating substrate member 2, and a first groove portion 51 which intersects the second groove portion 52. But the configuration of the groove portion 5 is to space the portions of the metal wiring 3 apart from each other. Further, the groove portion 5 is formed with a constant width MT except for each mounting portion 6.

As shown in FIG. 1B, each of the projections 4 is formed in the third metal wiring 33 at a position on an extension line of the first groove portion 51. The projection 4 is formed by forming curved groove portions 521, 522 each curved from the linear second groove portion 52 toward the first groove portion 51 so that a part of the third metal wiring 33 is projected toward the first groove portion 51. The projection 4 is formed to increase the wiring area of the third metal wiring 33 which is adjacent to the intersection region 54 at a location which is on the extension line of the first groove portion 51. The projection 4 is conventionally formed not beyond the location shown by the dotted line in FIG. 1B. However, in the present embodiment, a part of the metal wiring 3 is formed with a length of T1 and a maximum width of D1 in a curving projection to add a wiring area, to increase (widen) the area of the metal region. The projections 4 increase the wiring area so that when an external bending force is applied along the groove 5 of the flexible substrate member 1, the projections 4 can serve as a resistance mechanism against bending to prevent breaking of the metal wirings 3. Particularly, as the projection 4, the maximum width D1 is preferably greater than the width of the first groove portion 51 and the maximum length T1 is preferably greater than the width of the second groove portion 52, and for example, the width or the length which is five times or greater than the width of the metal wiring is preferable.

The projection 4 is formed under a condition that the planar dimension of the third metal wiring 33, which is indicated by the intersection between the first groove portion 51 and the second groove portions 52 and the third metal wiring 33 on the extension line of the first groove portion 51, is smaller than a predetermined planar dimension. The projection 4 is also formed under a condition that a total length of the metal wiring 3 in a direction of whole sheet width of the flexible substrate member 2 on an extension line of the first groove portion 51 is less than five times with respect to the length M1 (see FIG. 1A) of the first groove portion 51. That is, the projection 4 is formed under at least one of two conditions described above. The length M1 of the first groove portion 51 refers to, as shown in FIG. 1A, a dimension of the straight, continuous portion of the first groove portion 51, from the connection end of the intersection region 54.

Accordingly, as shown in the region A1 in FIG. 1A, that is, as shown in FIG. 1B, the projection 4 is formed at a position adjacent to an intersection region 54 where the first groove portion 51 perpendicularly intersects the second groove portion 52 which is formed along the longitudinal direction of the insulating substrate member 2. Further, the intersection region 54 has a configuration in which the first groove portion 51 intersects the second groove portion 52 in a direction toward the outer edge of the flexible substrate member 2. The whole width of the metal wiring 33 which is adjacent to the intersection region 54 to the end of the substrate member is very small with respect to the length of the metal wiring 33 which is adjacent to other intersection regions 54. Thus, the projection 4 is formed adjacent to the intersection region 54. Also, in the region indicated by A2 in FIG. 1A, the projection 4 is formed adjacent to the intersection region 54. In the portion outside of the region A2, on the extension line of the first groove portion 51, although the illustration is omitted in relation to a connector connection part 15 to be formed, a plurality of linear groove portions 5 which are extending in a same direction along the extension line of the first groove portion 51 are formed. Accordingly, the length of the metal wiring 3 adjacent to the intersection region 54 is smaller than five times the length M1 of the first groove portion 51 which is the comparison object, and the projection 4 is formed also in a direction where the first groove portion 51 extends inwardly of the substrate member.

As shown in FIG. 1B, in the case where the intersection region 54 of the first groove portion 51 intersecting the second groove portions 52 is formed in a Y-shape, the projection 4 is formed adjacent to the intersection portion 54 on the extension line of the first groove portion 51, and projecting toward the first groove portion 51. The flexible substrate member 1 which has a configuration as described above has protrusions 4 each formed in the intersection region 54 of the first groove portion 51 and the second groove portion 52, at a position on the third metal wiring on the extension line of the first groove portion 51. With the structure described above, the metal wirings 3 are hardly broken when an external bending force is applied along the first groove portion 51. Moreover, in the flexible substrate member 1, the position and the projection direction of each of the projection portions 4 are arranged on the extension line of the first groove portion 51, according to the shape of the intersection region 54 where the first groove portion 51 intersects the second groove portions 52. Other configurations of the projection 4 will be described below with reference to FIG. 5A through FIG. 6F.

Method of Manufacturing Flexible Substrate Member

Figure 3A:
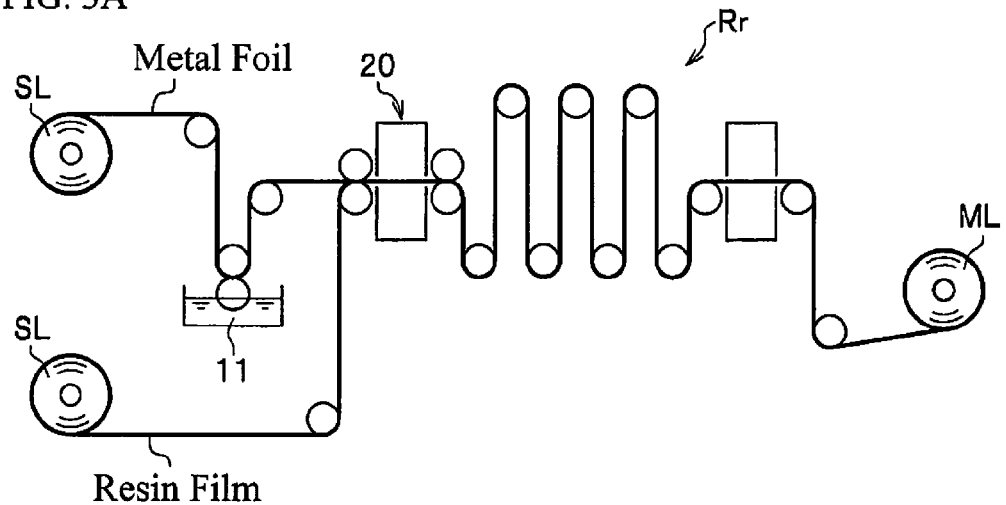
FIGS. 3A to 3C are schematic diagrams schematically showing a method of manufacturing a flexible substrate member according to an embodiment.

Next, a method of manufacturing a flexible substrate member 1 will be described. As shown in FIG. 2A, a resin film which is an insulating substrate member 2 is prepared with a width and thickness corresponding to the product 40 (see FIG. 3C), and a length appropriate to roll-to-roll technique. Also, a metal foil which is for the metal wiring 3 disposed on the resin film is prepared with a width, thickness, and length appropriate to roll-to-roll technique. Then, as shown in FIG. 3A, with the use of the roll-to roll lamination machine Rr, a metal foil is laminated via an adhesive material 11 on one side of the surface of the resin film which is wound around the sending roller SL (feeding coil), then the film is wound around the winding roller ML. In the example, the lamination machine Rr has a structure in which a drying mechanism 20 is arranged in the conveyor path so that the lamination and drying operations are performed simultaneously. Accordingly, as shown in FIG. 2B, the resin film and the metal foil are laminated.

Figure 3B:
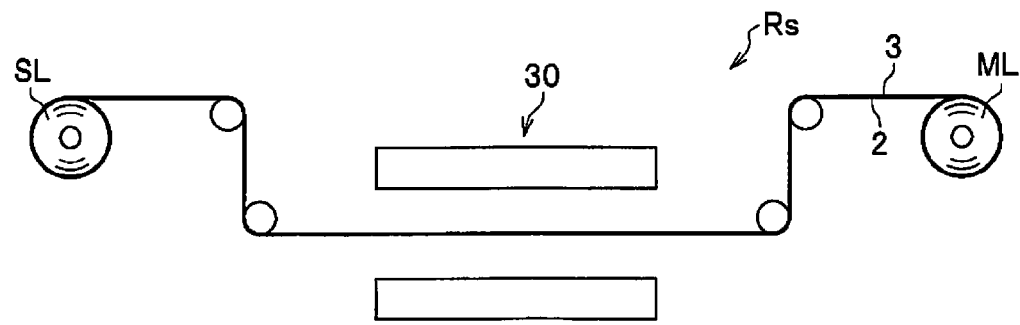

Next, as shown in FIG. 3B, with the use of an exposure device 30 etc., the metal foil is processed in a predetermined wiring pattern. First, a resist layer for processing the metal foil is formed. The resist layer is formed by way of printing or the like, to cover approximately the entire surface of the metal foil. Then, a mask with openings is disposed on the resist layer. For the resist layer, either positive-type or negative type can be used. Next, with the use of an exposure device 30, exposure light (ultraviolet light) is irradiated on the mask and the resist in the openings of the mask. Then, the mask is removed, and developing is performed. Thus, the resist layer in the region irradiated with the exposure light (or the region covered with the mask) is removed to obtain a resist layer with the openings. The metal foil is exposed in the openings. Next, using the resist layer with the openings as a mask, the metal foil exposed in the openings of the resist layer is etched. Thus, portions of the metal foil corresponding to the openings of the resist are removed. With the removal of the metal foil, the adhesive layer or the insulating substrate member (resin film) is exposed, and the exposed portion becomes the groove portion 5. In FIG. 3B, only the exposure device 30 is shown as a representative, but in detail, a resist layer forming (coating and drying) device and an exposure device and a developing device for processing the resist layer, and further, an etching device to etch the metal foil are included. Also, in FIG. 3B, the exposure process with the use of the exposure device 30 is illustrated as being performed in a single conveying device Rs, but the processes of before and after the exposure process may be performed in the same conveying device or in another conveying device. In the series of processing operations of the metal wiring, the projections 4 which serve as the predetermined positions of the metal wiring 3 are also formed in the respective intersection regions 54, and thus, the flexible substrate member 1 as shown in FIG. 2C is fabricated.

Figure 2D:
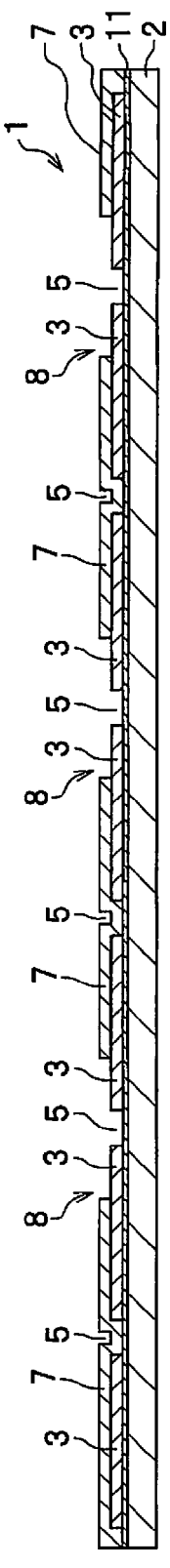
Figure 3C:
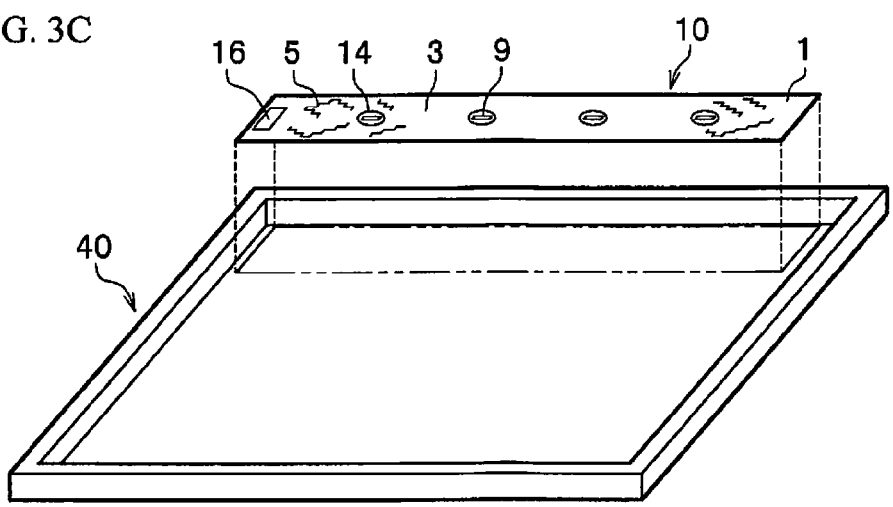

On the flexible substrate member 1, a protective layer 7 is disposed, for example, in a screen printing process (see FIG. 2D). Then, in the protective layer 7, mounting opening holes 8 are formed at portions to which the electron elements including a semiconductor element such as a light emitting element 9 are to be connected respectively. Then, the electron elements such as light emitting elements 9 are mounted in mounting operation, thus, the light emitting device 10 is manufactured. As shown in FIG. 3C, at the time of installation of the light emitting device 10 into the product 40, the light emitting device 10 is handled with the flexible substrate member 1 being cut to a predetermined length.

The flexible substrate member 1 and the light emitting device 10 which uses the flexible substrate member 1 are in a state in which, during the manufacturing and installation in the products, etc., when an external bending force is applied, the metal wiring 3 is hardly broken due to the projections 4 of the metal wiring 3 formed at positions on the extension line of the respective portions of the groove portion 5. In the method of manufacturing the flexible substrate member 1, the drying operation may be performed separately after the lamination operation of the resin film and the metal foil. Also, in FIGS. 3A and 3B, a roll-to-roll method is illustrated as a method of manufacturing the flexible substrate member, but a sheet laminating method in which an adhesive material 11 is disposed on a sheet of a resin film prepared in a predetermined size, then, a metal foil is attached, and further, exposure is performed.

Light Emitting Device

Next, the structure of the light emitting device which employs the flexible substrate member 1 will be described with reference to FIGS. 4A and 4B. In the description below, the same reference numerals will be applied to the configuration of the flexible substrate member 1 and description thereof will be appropriately omitted. In FIG. 4A, for ease of understanding, the positions of the light emitting elements 9 and the connector 16 are schematically shown in a cross section. The light emitting device 10 includes, as shown in FIG. 4A, a flexible substrate member 1 and a plurality of light emitting elements 9 disposed on the flexible substrate member 1. On the flexible substrate member 1, a protective layer 7 is formed on a plurality of metal wirings 3 and the light emitting elements 9 are mounted on the respective portions of the metal wirings 3. The protective layer 7 is, for example, a white resin layer, to protect the metal wirings 3, and preferably capable of reflecting light from the light emitting elements 9. In the case where the protective layer 7 is formed, mounting opening holes 8 to expose the metal wirings 3 are formed at positions where the respective light emitting elements 9 to be connected.

For the light emitting elements 9, a semiconductor light emitting element such as an LED is suitably used. It is suitable that such a light emitting element includes a light emitting layer of a semiconductor such as ZnS, SiC, GaN, GaP, InN, AlN, ZnSe, GaAsP, GaAlAs, InGaN, GaAlN, AlInGaP, or AlInGaN, formed on a substrate by using, such as a liquid phase growing method, an HDVPE method, or a MOCVD method. For the light emitting elements 9, the emission wavelength can be selected variously from ultraviolet light to infrared light by selecting the materials of the semiconductor layer and the ratio of the mixed crystals. For the material of the light emitting layer, for example, $In_XAl_YGa_{1-X-Y}N$ ($0 \le X \le 1$, $X+Y \le 1$) can be used.

The light emitting element 9 can be formed in a configuration in which various fluorescent materials which are excited by the emission of the light emitting element 9 and emit light of different wavelength than the light of the light emitting element 9 are used in combination. For example, such a fluorescent material can be mixed in a sealing resin. The fluorescent material can be appropriately selected according to the product to which the light emitting device 10 is installed. For example, the light emitting device can be used with a sheet which includes the fluorescent material. The fluorescent material is not specifically limited as long as it can be used appropriately with the light emitting element 9.

A connector connection part 15 is formed at a predetermined position of the metal wirings 3 and a connector 16 is disposed on the connector connection part 15. The protective element and necessary electron elements are disposed in the mounting opening holes 8 respectively. The light emitting element 9 is connected to the metal wiring 3 through the two bumps 13, 13, and then an underfill 12 is disposed. In the embodiment, the underfill 12 is disposed to cover the side surfaces of the light emitting element 9. The underfill 12 is disposed in the gap between the light emitting element 9 and the insulating substrate member 2. With the underfill 12, the reliability of bonding between the light emitting element 9 and the flexible substrate member 1 can be improved. The material, color, viscosity etc., of the underfill 12 is not specifically limited as long as it can be suitably applied to the light emitting element 9.

The sealing resin member 14 is filled in a state where the light emitting element 9 is mounted on the mounting portion 6, and serves to protect the light emitting element 9 from external force and moisture etc., and also serves to protect the conductive members such as the bumps 13. The sealing resin member 14 has a light transmissive property for extraction of light emitted from the light emitting element 9. Examples of the resin material which can be used for such a sealing resin member 14 include light transmissive resins with good weather resistance, such as an epoxy resin, a silicone resin, an acrylic resin, and a urea resin. Moreover, when appropriate, a filler or a light-scattering material may be dispersed in the sealing resin member 14, and further, a wavelength converting layer which contains a wavelength converting member such as a fluorescent material can be provided on the sealing resin member 14. The sealing resin member 14 is not specifically limited as long as it can suitably applied to seal and protect the light emitting element 9 and allows light from the light emitting element 9 to pass through.

The light emitting device 10 has a structure as described above, so that, for example, at the time of assembling into a product 40, even when an external bending force is applied on the flexible substrate member 1, the metal wiring 3 is hardly broken due to the projections 4 formed at the intersection regions 54 of the groove portion 5 which separates the parts of the metal wiring 3, compared to the flexible substrate members which are not provided with the projections 4.

As described above, in the flexible substrate member 1 and the light emitting device 10 which employs the flexible substrate member 1, the mechanical strength of the metal wiring 3 can be improved by forming the projections 4 on the extension line of the respective parts of the groove portion 5 in the intersection regions 54, and the configuration of the projections 4 may be such shown in FIGS. 5A to 6F. In the examples shown in FIGS. 5A to 5F, and FIGS. 6A to 6F, portions which are different than that described in FIGS. 1A through 2D will be mainly described in series below. As shown in FIG. 5A, a projection 4A is formed on the extension line of the first groove portion 51, projecting in a triangular shape from the third metal wiring 33 toward the first groove portion 51 side. The projection 4A is formed projecting from the third metal wiring 33 along the inclined groove portions 521a, 522a which are formed from the second groove portion 52 toward the first groove portion 51 in a linear shape at a predetermined angle.

As shown in FIG. 5B, a projection 4B is formed on the extension line of the first groove portion 51, projecting in a semi-oval shape or a semi-circular shape from the third metal wiring 33 toward the first groove portion 51 side. The projection 4B is formed projecting from the third metal wiring 33 along the arc-shaped groove portions 521b, 522b which are formed from the second groove portion 52 toward the first groove portion 51 in an arc shape. As shown in FIG. 5C, a projection 4C is formed on the extension line of the first groove portion 51, projecting in a trapezoidal shape from the third metal wiring 33 toward the first groove portion 51 side. The projection 4C is formed projecting from the third metal wiring 33 along the inclined with a bent groove portions 521c, 522c which are formed from the second groove portion 52 toward the first groove portion 51 in a linear shape and a bent at predetermined angles respectively.

As shown in FIG. 5D, a projection 4D is formed on the extension line of the first groove portion 51, projecting in a semi-oval shape or a semi-circular shape, in a similar configuration as in FIG. 5B, toward the first groove portion 51 side. The projection 4D is formed projecting from the third metal wiring 33 along the arc-shaped groove portions 521d, 522d which are formed from the second groove portion 52 toward the first groove portion 51 in an arc shape. In this example, a configuration which is different from that in FIG. 5B is provided, which is a wavy-line-shaped portion 52d in which a portion of the second groove portion 52 is not formed in a linear shape but is formed in a wavy line shape so that a projection 41D is formed adjacent to the projection 4D with the same degree of projection. In this example, the projection 41D which is different projection than the projection 4D is formed side by side with the projection 4D. That is, in the case where the projection 4D is formed, the shape of the second groove portions 52 may either be linear or curved, as long as the projection 4D is provided on the extension line of the first groove portion 51.

FIGS. 5A to 5D illustrate examples in which the projections 4A to 4D are formed in the structures in which the first groove portion 51 is perpendicularly intersected the second groove portion 52. But as shown in FIGS. 5E and 5F, the configuration may be such that the first groove portion 51e is intersected the second groove portion 52 at a predetermined angle other than 90 degrees, and a projection 4E is formed in the intersection region 54e. Further, as shown in FIG. 5F, the intersection region 54f may be formed with a plurality of groove portions, for example, a first groove portion 51e and a third groove portion 53f are intersected the second groove portion 52, and the projection 4F is formed according to the shape of the intersection region 54f. Moreover, as shown in FIG. 5E, the arc-shaped groove portions 521e, 522e are not necessary to be symmetric. Further, as shown in FIG. 5F, a fourth metal wiring 34 is demarcated by a third groove portion 53f. The fourth metal wiring 34 is formed either a positive electrode wiring pattern 3P or a negative electrode wiring pattern 3N. The intersection region 54f may include two portions, a portion intersecting the first groove portion 51e via an arc-shaped groove portion 521f and an arc-shaped groove portion 523f, and a portion intersecting the third groove portion 53f via an arc-shaped groove portion 523f and an arc-shaped groove portion 522f.

In FIGS. 5A to 5F, the projections 4A to 4F are formed projecting toward the first groove portion 51 side, but as shown in FIGS. 6A to 6C, the projections 4G, 4H, 4I may be formed projecting from the third metal wiring 33 toward the opposite side (another side) of the first groove portion 51, in other word, the projections 4G, 4H, 4I may project along the extension line of the first groove portion from the second side of the third metal wiring.

The projections 4G, 4H, 4I are respectively projecting on the extension line of the first groove portion 51. In a configuration having the projection 4G, 4H, or 4I, other grooves formed approximately in parallel to the second groove portion 52 (see FIG. 1B) may have a shape as it is, or may be shaped according to the respective projections.

Further, as shown in FIGS. 6D and 6E, the projections 4J and 4K may be formed spaced apart from the third metal wiring 33. In FIG. 6D, the projection 4J is formed in the intersection region 54j as an island portion which is spaced apart from the first metal wiring 31, the second metal wiring 32, and the third metal wiring 33, and on the extension line of the first groove portion 51. Although other first metal wiring 31 to third metal wiring 33 are either of a positive electrode wiring pattern 3P or a negative electrode wiring pattern 3N, the projection 4J does not serve as an electrode. That is, the projection J is individually arranged at a location separate from the positive electrode wiring pattern 3P or the negative electrode wiring pattern 3N. Also, the projection 4J is formed projecting to the first groove portion 51 side in a state spaced apart from the third metal wiring 33. The projection 4J is formed approximately at the center of the semicircular intersection region 54j.

In FIG. 6E, the projection 4K includes a metal island portion 41K and a projecting curved portion 42K on the extension line of the first groove portion 51. The metal island portion 41K is formed in the intersection region which is formed in a circular shape, spaced apart from the first metal wiring 31, the second metal wiring 32, and the third metal wiring 33. The projecting curved portion 42K is projected from the third metal wiring 33 to the opposite side of the first groove portion 51. The metal island portion 41K is formed approximately at the center of the intersection region 54K which is formed in a circular shape, so that an approximately uniform groove width of the first groove portion 51 and the second groove portion 52 can be maintained. The metal island 41K does not serve as an electrode, as in the configuration illustrated in FIG. 6D. The projecting curved portion 42K has, at the intersection region 54k side, a recessed shape curving according to the shape of the intersection region 54k, and at a distal side from the first groove portion 51 which is the opposite side from the intersection region 54k, a projection in a semielliptic shape or a semicircular shape.

As shown in FIG. 6F, in addition to the projection 4B in the configuration shown in FIG. 5B, a projection 4L may be formed on the third metal wiring 33 in the opposite direction to the first groove portion 51. The configurations shown in FIGS. 5A, 5C to 5F may also have a projection 4L, or a shape linearly symmetrical with the third metal wiring 33, respectively.

As described above, forming a projection 4 (for example, 4A to 4L) projecting from the third metal wiring 33 in the flexible substrate member 1 can enhance the mechanical strength of the metal wiring 3 against an external bending force and prevent the breakage of the flexible substrate member 1. Accordingly, as long as it is positioned on the extension line of the first groove portion 51, the projection 4 may have a shape projecting toward the first groove portion 51 from the third metal wiring 33, or projecting from the third metal wiring 33 to the opposite side of the first groove portion 51. In the specification, the term "projecting" refers to a configuration in which a projection is formed toward the first groove portion 51 with respect to the linear portion of the second groove portion 52, or in which a protrusion is formed toward opposite side from the first grove portion 51 with respect to the linear portion of the third metal wiring 33. In the flexible substrate member 1, the intersection region 54 may be formed by the first groove portion 51 perpendicularly intersecting the second groove portion 52 or intersecting the second groove portions at a predetermined angle (see FIGS. 5E, 5F). Also, as long as the projection 4 (for example, 4A to 4L) it is positioned on the extension line of the first groove portion 51, the projection 4 may have a shape projecting toward the first groove portion 51 from the third metal wiring 4, or projecting from the third metal wiring 33 to the opposite side of the first groove portion 51.

Further, in the flexible substrate member 1, as shown in FIG. 1A, the groove portion 5 is formed in a stepwise bent pattern, in which straight portions in a same direction which adjoin a single straight portion does not have a length which is five times greater than the single straight portion. Thus, together with the configuration of the projection 4 (for example, 4A to 4L), a structure which is resistant to damage can be obtained. Due to the configuration, the outer circumferential edge portion of the flexible substrate member 1 requires the groove portion 5 to be linearly continuous. In the case where the projection 4 (for example, 4A to 4L) to be formed, a three-forked portion (intersection region) or an intersection where a plurality of grooves intersect is required, and the projection 4 is formed at a predetermined position under the conditions described above.

The configurations of the flexible substrate member 1 and the light emitting device 10 described above are intended as illustrative of a flexible substrate member 1 and a light emitting device 10 which employs the flexible substrate member to give a concrete form to the technical ideas of the present invention and a flexible substrate member 1 and a light emitting device 10 which employs the flexible substrate member according to the present invention is not limited to those examples shown above. Further, the members shown in claims attached hereto are not specifically limited to members in the embodiments. The sizes, materials, shapes and the relative configuration etc. of the members described in embodiments are given as an example and not as a limitation to the scope of the invention unless specifically described otherwise.

INDUSTRIAL APPLICABILITY

The flexible substrate member and the light emitting device which uses the flexible substrate according to the embodiments can be used for various kinds of light sources, such as illumination light sources, light sources for various kinds of indicators, light sources for automobile use, light sources for displays, back light sources for liquid crystal displays, signals, automobile use, channel control characters for channel boards.

As described above, it should be obvious that various other embodiments are possible without departing the spirit and scope of the present invention. Accordingly, the scope and spirit of the present invention should be limited only by the following claims.

What is claimed is:

1. A flexible substrate member comprising:
an insulating substrate member;
a groove portion including a first groove portion, a second groove portion, and an intersection region;
the intersection region disposed where the first groove portion and the second groove portion intersect; and
a plurality of metal wiring including a first metal wiring, a second metal wiring, and a third metal wiring,
the first metal wiring separated from the second metal wiring by the first groove portion in the intersection region with the first metal wiring defining a first edge of the first groove portion and the second metal wiring defining a second edge of the first groove portion in the intersection region,
the third metal wiring separated from the first metal wiring and the second metal wiring by the second groove portion,
the third metal wiring includes a projection projecting toward and/or away from the first groove portion in a plan view, and
at least a part of the projection being arranged between a first extension line of the first edge of the first groove extending toward the third metal wiring and a second extension line of the second edge of the first groove extending toward the third metal wiring in the plan view.

2. The flexible substrate member according to claim 1, wherein:
the projection projects from the third metal wiring towards the first groove portion.

3. The flexible substrate member according to claim 1, wherein:
the third metal wiring further includes a first side facing the second groove portion and a second side opposite the first side; and
the projection projects away from the first groove portion from the second side of the third metal wiring.

4. A flexible substrate member comprising:
an insulating substrate member;
a groove portion including a first groove portion, a second groove portion, and an intersection region;
the intersection region disposed where the first groove portion and the second groove portion intersect; and
a plurality of metal wiring including a first metal wiring, a second metal wiring, and a third metal wiring,
the first metal wiring separated from the second metal wiring by the first groove portion in the intersection region,
the third metal wiring separated from the first metal wiring and the second metal wiring by the second groove portion,
the intersection region including a metal island spaced apart from the first metal wiring, the second metal wiring, and the third metal wiring, and the metal island is projected in the intersection region toward the first groove portion in a plan view, and the metal island, the first metal wiring, the second metal wiring and the third metal wiring do not overlap each other in the plan view.

5. The flexible substrate member according to claim 1, further including:
a third groove portion disposed in the intersection region, the third groove portion intersecting both the first groove portion and the second groove portion.

6. A light emitting device comprising a light emitting element mounted on the flexible substrate member according to claim 1.

7. The flexible substrate member according to claim 2, wherein:
the third metal wiring further includes a first side facing the second groove portion and a second side opposite the first side; and
the projection projects away from the first groove portion from the second side of the third metal wiring.

8. The flexible substrate member according to claim 4, further including:
a third groove portion disposed in the intersection region, the third groove portion intersecting both the first groove portion and the second groove portion.

9. The flexible substrate member according to claim 4, wherein:
the third metal wiring further includes a first side facing the second groove portion and a second side opposite the first side; and
the projection projects away from the first groove portion from the second side of the third metal wiring.

10. A light emitting device comprising a light emitting element mounted on the flexible substrate member according to claim 4.

11. The flexible substrate member according to claim 1, wherein
the insulating substrate member has an elongated shape extending in a longitudinal direction, and
the first groove portion extends along a width direction that intersects the longitudinal direction of the insulating substrate member.

12. The flexible substrate member according to claim 1, wherein
the projection faces both the first metal wiring and the second metal wiring in a direction along which the first groove portion extends.

13. The light emitting device according to claim 6, wherein
the flexible substrate further includes a light reflective protective layer disposed on the metal wiring and the insulating substrate member.

14. The light emitting device according to claim 6, wherein
the light emitting element is connected to the metal wiring through a pair of conductive members disposed between the light emitting element and the metal wiring.

15. The flexible substrate member according to claim 4, wherein
the insulating substrate member has an elongated shape extending in a longitudinal direction, and
the first groove portion extends along a width direction that intersects the longitudinal direction of the insulating substrate member.

16. The flexible substrate member according to claim 4, wherein the metal island faces both the first metal wiring and the second metal wiring in a direction along which the first groove portion extends.

17. The light emitting device according to claim 10, wherein
the flexible substrate further includes a light reflective protective layer disposed on the metal wiring and the insulating substrate member.

18. The light emitting device according to claim 10, wherein
the light emitting element is connected to the metal wiring through a pair of conductive members disposed between the light emitting element and the metal wiring.

19. The light emitting device according to claim 6, wherein
the insulating substrate member is a resin film with flexibility.

20. The light emitting device according to claim 10, wherein
the insulating substrate member is a resin film with flexibility.

* * * * *